United States Patent
Buynoski et al.

(10) Patent No.: US 6,770,905 B1
(45) Date of Patent: Aug. 3, 2004

(54) IMPLANTATION FOR THE FORMATION OF CUX LAYER IN AN ORGANIC MEMORY DEVICE

(75) Inventors: Matthew S. Buynoski, Palo Alto, CA (US); Suzette K. Pangrle, Cupertino, CA (US); Sergey D. Lopatin, Santa Clara, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 237 days.

(21) Appl. No.: 10/314,054

(22) Filed: Dec. 5, 2002

(51) Int. Cl.$^7$ ............................................... H01L 29/40
(52) U.S. Cl. ........................ 257/40; 257/40; 257/257; 257/762
(58) Field of Search ............................. 257/40; 438/99, 438/584, 642, 800, 648; 365/163, 175

(56) References Cited

U.S. PATENT DOCUMENTS

| | | | |
|---|---|---|---|
| 4,663,270 A | 5/1987 | Potember et al. ........... 430/495 |
| 5,589,692 A | 12/1996 | Reed ............................ 257/23 |
| 6,055,180 A | 4/2000 | Gudesen et al. ............ 365/175 |
| 6,072,716 A * | 6/2000 | Jacobson et al. ........... 365/163 |
| 6,208,553 B1 | 3/2001 | Gryko et al. ................ 365/151 |
| 6,212,093 B1 | 4/2001 | Lindsey ....................... 365/151 |
| 6,272,038 B1 | 8/2001 | Clausen et al. ............. 365/181 |
| 6,314,019 B1 | 11/2001 | Kuckes et al. .............. 365/151 |
| 6,320,200 B1 | 11/2001 | Reed et al. .................... 257/40 |
| 6,324,091 B1 | 11/2001 | Gryko et al. ................ 365/151 |
| 6,348,700 B1 | 2/2002 | Ellenbogen et al. .......... 257/40 |
| 6,656,763 B1 * | 12/2003 | Oglesby et al. ............... 438/99 |

* cited by examiner

Primary Examiner—David Nelms
Assistant Examiner—Thinh T Nguyen
(74) Attorney, Agent, or Firm—Amin & Turocy, LLP (57) ABSTRACT

An organic memory cell having a CuX layer made by implantation is disclosed. The organic memory cell is made of two electrodes, at least one containing copper, with a controllably conductive media between the two electrodes. The controllably conductive media contains an organic semiconductor layer and CuX layer made by implantation of a Group VIB element.

20 Claims, 3 Drawing Sheets

IMPLANTATION FOR THE FORMATION OF CUX LAYER IN AN ORGANIC MEMORY DEVICE

TECHNICAL FIELD

The present invention generally relates to using implantation to form passive layers in organic memory devices. In particular, the present invention relates to CuX passive layers formed by implantation in memory devices containing an organic semiconductor.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses. Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Higher doping levels tend to minimize the separation required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversible degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides organic memory devices containing organic memory cells having a CuX layer formed by implantation into a copper containing electrode. In this context, X is a Group VIB element. Consequently, the thickness of the CuX layer is relatively small and controllable, compared with forming CuX layers by other methods. Moreover, since the CuX layer is formed within an electrode, delamination concerns are mitigated.

The organic memory devices containing the organic memory cells having a CuX layer possess one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the present invention relates to an organic memory device containing at least one organic memory cell made of two electrodes, at least one of which contains copper, with a controllably conductive media between the two electrodes, the controllably conductive media containing an organic semiconductor layer and CuX layer formed by implantation into the copper containing electrode. Other aspects of the present invention relate to making the organic memory devices/cells, using implantation and optional heating/annealing.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention involves using implantation to form CuX layers in organic memory cells made of two electrodes with a controllably conductive media between the two electrodes. The controllably conductive media contains an organic semiconductor layer and the CuX layer, the latter formed by implantation. The organic memory cells may optionally contain additional layers, such as additional electrodes, charge retention layers, and/or chemically active layers. The impedance of the controllably conductive media changes when an external stimulus such as an applied electric field is imposed. A plurality of organic memory cells, which may be referred to as an array, form an organic memory device. In this connection, organic memory cells may form an organic memory device and function in a manner analogous to metal oxide semiconductor field effect transistors (MOSFETs) in conventional semiconductor memory devices. However, there are advantages to using the organic memory cells instead of conventional MOSFETs in memory devices.

Figure 1:
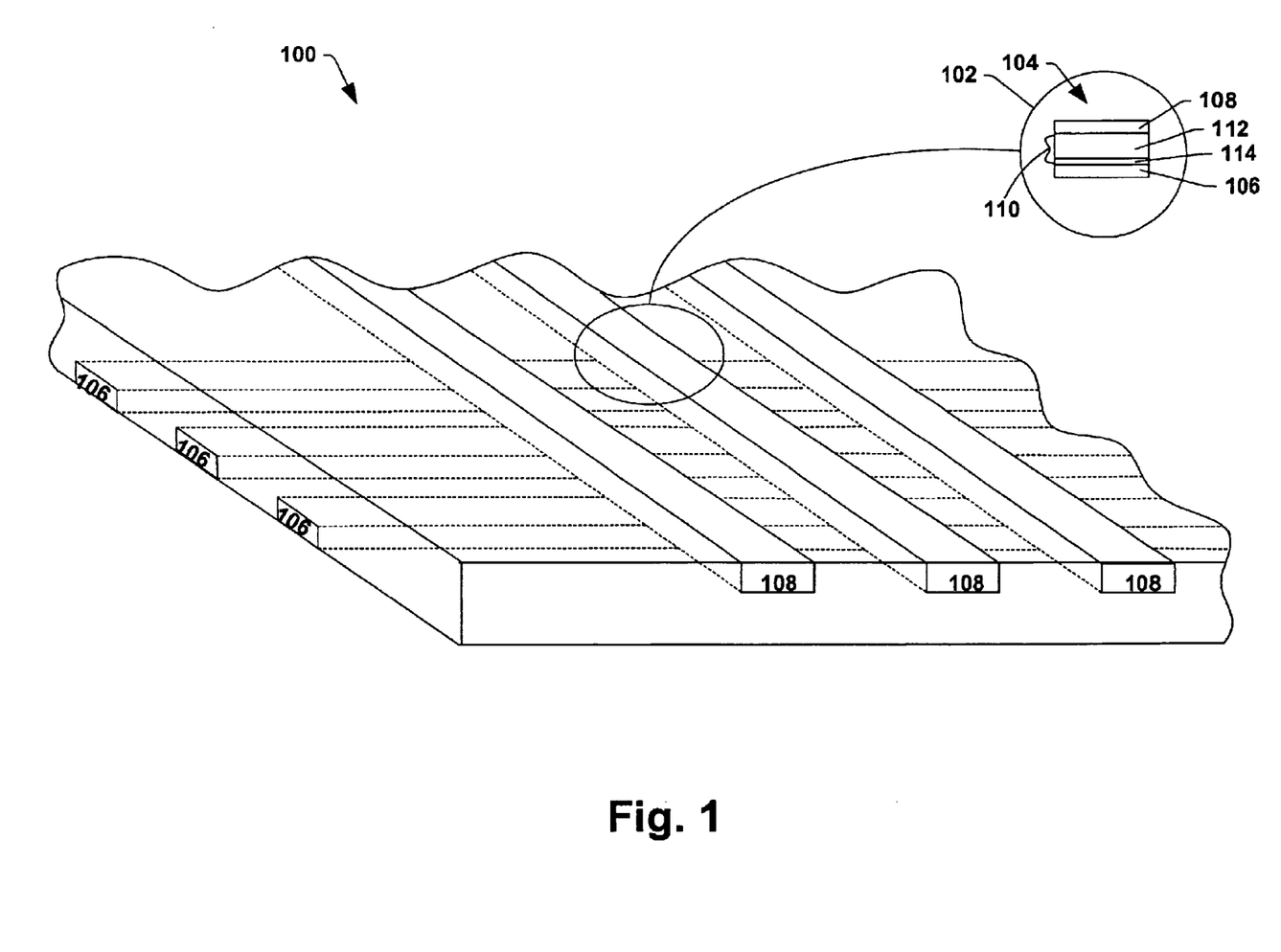
FIG. 1 illustrates a perspective view of a two dimensional microelectronic device containing a plurality of organic memory cells in accordance with one aspect of the invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 containing copper and a second electrode 108 with a controllably conductive media 110 therebetween. The controllably conductive media 110 contains an organic semiconductor layer 112 and CuX layer 114 that is formed by implantation techniques. Peripheral circuitry and devices are not shown for brevity.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like. However, the electrode that is adjacent the CuX layer contains at least copper, so as to permit formation of a CuX layer by implantation.

Examples of materials for the electrode that is not adjacent the CuX layer include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys. One or more of these materials may be present in combination with copper the electrode that is adjacent the CuX layer.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more CuX layers. In one embodiment, the controllably conductive media contains at least one organic semiconductor layer that is adjacent a CuX layer (without any intermediary layers between the organic semiconductor layer and CuX layer).

The organic semiconductor layer contains at least one of an organic polymer (such as a conjugated organic polymer), an organometallic compound (such as a conjugated organometallic compound), an organometallic polymer (such as a conjugated organometallic polymer), carbon structures such as carbon nanotubes and buckyballs, and the like. Organic semiconductors thus have a carbon based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccerball-shaped 60-atom or 70-atom cluster of pure carbon.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable states. The two relatively stable oxidation states permit the organic semiconductor to donate and accept charges and electrically interact with the conductivity facilitating compound. The ability of the organic semiconductor layer to donate and accept charges and electrically interact with the CuX layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol-derivatized polyporphyrins; polymetallocenes such as polyferrocenes, polyphthalocyanines; polyvinylenes; polystiroles; and the like.

Chemical structures of examples of repeating units/moieties that make up the conjugated organic polymers and conjugated organometallic polymers include one or more of Formulae (I) to (XIII):

(I)

(II)

(III)

(IV)

-continued

(V)

(VI)

(VII)

(VIII)

(IX)

(X)

(XI)

(XII)

(XIII)

wherein each R is independently hydrogen or hydrocarbyl; each M is independently a metal; each E is independently O, N, S, Se, Te, or CH; each L is independently a group containing or continuing conjugation (unsaturation); and each n is independently about 1 or more and about 25,000 or less. In another embodiment, each n is independently about 2 or more and about 10,000 or less. In yet another embodiment, each n is independently about 20 or more and about 5,000 or less. Examples of metals include Ag, Al, Au, Cd, Co, Cu, Fe, Ga, Ir, Mg, Mn, Ni, Pb, Pd, Pt, Rh, Sn, and Zn. Examples of L groups include hydrocarbyl groups possessing conjugation or the ability to form resonance structures, such as phenyl groups, substituted phenyl groups, acetylene groups, and the like.

Any of the formulae may have one or more pendent substituent groups, not shown in the formulae. For example, a phenyl group may appear on the polythiophene structure, such as on the 3 position of each thiophene moiety. As another example, alkyl, alkoxy, cyano, amino, and/or hydroxy substituent groups may be present on the phenyl rings in any of the polyphenylacetylene, polydiphenylacetylene, and poly(p-phenylene vinylene) conjugated polymers.

The term "hydrocarbyl" includes hydrocarbon as well as substantially hydrocarbon groups. Hydrocarbyl groups contain 1 or more carbon atom and typically about 60 or less carbon atoms. In another embodiment, hydrocarbyl groups contain 2 or more carbon atoms and about 30 or less carbon atoms. Substantially hydrocarbon describes groups which contain heteroatom substituents or heteroatoms which do not alter the predominantly organic character of the polymer, and do not impede the ability of the organic polymer to form a conjugated structure. Examples of hydrocarbyl groups include the following:

(1) hydrocarbon substituents, i.e., aliphatic (e.g., alkyl or alkenyl), alicyclic (e.g., cycloalkyl, cycloalkenyl) substituents, acyl, phenyl, aromatic-, aliphatic- and alicyclic-substituted aromatic substituents and the like as well as cyclic substituents wherein the ring is completed through another portion of the molecule (that is, for example, any two indicated substituents may together form an alicyclic radical);

(2) substituted hydrocarbon substituents, i.e., those substituents containing non-hydrocarbon groups which, in the context of this invention, do not alter the predominantly organic nature of the substituent; those skilled in the art will be aware of such groups (e.g., halo (especially chloro and fluoro, such as perfluoroalkyl, perfluoroaryl), cyano, thiocyanato, amino, alkylamino, sulfonyl, hydroxy, mercapto, nitro, nitroso, sulfoxy, etc.);

(3) heteroatom substituents, i.e., substituents which, while having a predominantly organic character within the context of this invention, contain an atom other than carbon present in a ring or chain otherwise composed of carbon atoms (e.g., alkoxy, alkylthio). Suitable heteroatoms will be apparent to those of ordinary skill in the art and include, for example, sulfur, oxygen, nitrogen, fluorine, chlorine, and such substituents as, e.g., pyridyl, furyl, thienyl, imidazolyl, imido, amido, carbamoyl, etc.

In one embodiment, the organic semiconductor layer contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 μm or less. In another embodiment, the thin layer has a thickness of about 100 Å or more and about 0.05 μm or less. For example, an organic memory cell may contain a first electrode of copper, a CuX layer, an organic semiconductor layer of poly(phenylene vinylene), and a second electrode of aluminum, wherein the poly(phenylene vinylene) organic semiconductor layer contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the organic memory cells optionally contain an organometallic compound layer. In still yet another embodiment, the organic semiconductor material contains an organometallic compound. Examples of the chemical structures of various organometallic compounds include Formulae (XIV) to (XVII):

(XIV)

(XV)

(XVI)

(XVII)

wherein M and E are as defined above.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like .

In one embodiment, the organic semiconductor layer has a thickness of about 0.001 $\mu$m or more and about 5 $\mu$m or less. In another embodiment, the organic semiconductor layer has a thickness of about 0.01 $\mu$m or more and about 2.5 $\mu$m or less. In yet another embodiment, the organic semiconductor layer has a thickness of about 0.05 $\mu$m or more and about 1 $\mu$m or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/CuX layer.

A covalent bond may be formed between the organic semiconductor material and the CuX layer. Alternatively, close contact is required to provide good charge carrier/electron exchange between the organic semiconductor layer and the CuX layer. The organic semiconductor layer and the CuX layer are electrically coupled in that charge carrier/electron exchange occurs between the two layers.

A passive layer contains at least one CuX conductivity facilitating compound that contributes to the controllably conductive properties of the controllably conductive media. The CuX conductivity facilitating compound, formed by implantation, has the ability to donate and accept charges (holes and/or electrons) and/or act as a source of copper ions. The CuX layer thus may transport holes, electrons, and/or ions between an electrode and the organic polymer layer/CuX layer interface, facilitate charge/carrier injection into the organic polymer layer, and/or increase the concentration of a charge carrier (ions, holes and/or electrons) in the organic polymer layer. In some instances, the CuX layer may store opposite charges thereby providing a balance of charges in the organic memory device as a whole. Storing charges/charge carriers is facilitated by the existence of two relatively stable oxidation states for the conductivity facilitating compound.

The fermi level of the CuX layer is close to the valence band of the organic semiconductor layer. Consequently, the injected charge carrier (into the organic semiconductor layer) may recombine with the charge at the CuX layer if the energy band of the charged organic semiconductor layer does not substantially change. Positioning energy bands involves compromising between ease of charge injection and length of charge (data) retention time.

The applied external field can reduce the energy barrier between CuX layer and organic layer depending on the field direction. Therefore, enhanced charge injection in the forward direction field in programming operation and also enhanced charge recombination in reversed field in erase operation can be obtained.

The CuX layer may in some instances act as a catalyst when forming the organic semiconductor layer, particularly when the organic semiconductor layer contains a conjugated organic polymer. In this connection, the polymer backbone of the conjugated organic polymer may initially form adjacent the CuX layer (on the side opposite the copper containing electrode), and grow or assemble away and substantially perpendicular to the passive layer surface.

Examples of conductivity facilitating compounds that may make up the CuX layer are Group VI-copper compounds or CuX conductivity facilitating compounds (X represents a Group VIB element). In the CuX chemical formula, there may be one or more copper atoms and one or more X atoms (such as $Cu_2X$, CuX), although a subscript numerical designation is not provided in the chemical formula for brevity. Group VI elements include oxygen, sulfur, selenium, and tellurium. Specific examples of conductivity facilitating compounds include one or more of copper oxide ($Cu_2O$, CuO), copper sulfide ($Cu_2S$, CuS), copper rich copper sulfide ($Cu_3S$, CuS; $Cu_3S$, $Cu_2S$), copper selenide ($Cu_2Se$, CuSe), copper telluride ($Cu_2Te$, CuTe), and the like. The conductivity facilitating compounds do not necessarily dissociate into ions under the strength of the electric field, although ions may move through them. The CuX layer may contain two or more sub-CuX layers, each sub-layer containing the same, different, or multiple conductivity facilitating compounds.

The CuX layer is formed using implantation techniques. That is, implantation is effected directly into a copper electrode. The implanted Group VI atoms (X) combine with copper atoms in the shallow/upper regions of the copper containing electrode to form CuX in situ.

In order to facilitate the formation of a relatively thin passive layer in a controllable manner, relatively low energy levels are employed during implantation (generally about 10 keV or less). One or more of sulfur, selenium, tellurium, and/or polonium are implanted into the copper electrode. Sulfur, selenium, and/or tellurium, can be implanted into the copper electrode, or a compound containing sulfur, selenium, and/or tellurium atoms can be implanted into the copper electrode.

In one embodiment, one or more Group VI elements are implanted in the copper electrode at a concentration from about $1 \times 10^{15}$ to about $1 \times 10^{17}$ atoms/cm$^2$ at an energy level from about 0.1 keV to about 50 keV. In another embodiment, one or more Group VI elements are implanted in the copper electrode at a concentration from about $1 \times 10^{12}$ to about $1 \times 10^{16}$ atoms/cm$^2$ at an energy level from about 1 keV to about 20 keV. In yet another embodiment, one or more Group VI elements are implanted in the copper electrode at a concentration from about $1 \times 10^{13}$ to about $1 \times 10^{15}$ atoms/$cm^2$ at an energy level from about 2 keV to about 10 keV.

In one embodiment, the CuX layer containing the conductivity facilitating compound has a thickness of about 2 Å or more and about 0.1 μm or less. In another embodiment, the CuX layer has a thickness of about 10 Å or more and about 0.01 μm or less. In yet another embodiment, the CuX layer has a thickness of about 50 Å or more and about 0.05 μm or less.

Using an implantation technique to form the CuX layer, creating CuX layers generally having a thickness of about 0.025 μm or less is facilitated. Moreover, an implantation technique to form the CuX layer, controlling the precise thickness of CuX layers is facilitated. Such control is facilitated by precisely setting or adjusting the energy of implantation and/or the concentration of the resultant implantation. Since the CuX layer is formed integrally within the copper electrode, the prospect of delamination is mitigated and/or eliminated. Complexities and problems associated with chemical vapor deposition formation of a CuX layer are also mitigated and/or eliminated by using implantation.

In some instances, to promote long charge retention times (in the organic semiconductor layer), the CuX layer is optionally treated with a plasma after it is formed. The plasma treatment modifies the energy barrier of the CuX layer.

Alternatively or additionally, the CuX layer is optionally heated or annealed. Annealing specifically includes rapid thermal annealing. In one embodiment, the implanted copper electrode (electrode and partially formed CuX layer) is heated at a temperature from about 200° C. to about 500° C. for about 1 second to about 30 minutes. In another embodiment, the implanted copper electrode is heated at a temperature from about 225° C. to about 450° C. for about 1 second to about 10 minutes. In yet another embodiment, the implanted copper electrode is heated at a temperature from about 250° C. to about 400° C. for about 2 seconds to about 2 minutes.

The optional heat treatment/annealing performed under an inert or non-reactive environment. For example, the chamber in which heating takers place may contain one or more of hydrogen ($H_2$), nitrogen ($N_2$), helium, neon, argon, krypton, xenon, and the like. For example, the heating chamber may contain a mixture of nitrogen and hydrogen or a mixture of nitrogen and argon.

Figure 2:
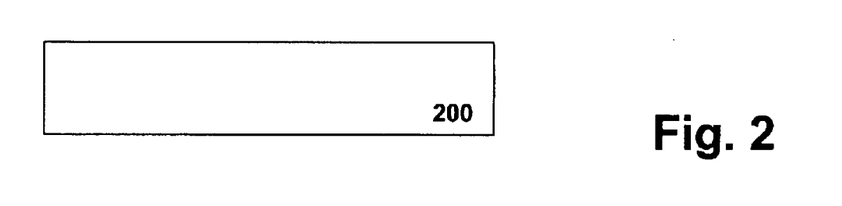
FIG. 2 illustrates a cross sectional view of forming a CuX layer in accordance with one aspect of the invention.
Figure 3:
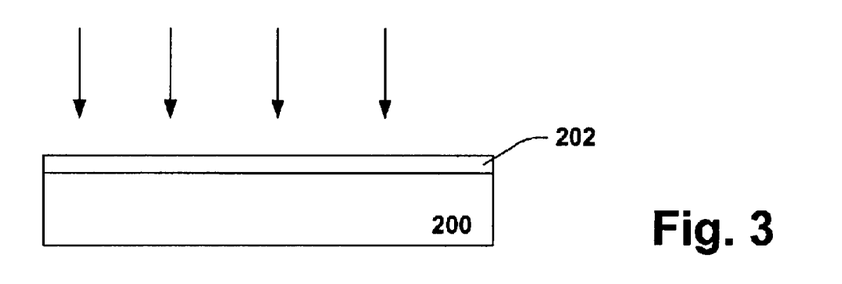
FIG. 3 illustrates a cross sectional view of forming a CuX layer in accordance with one aspect of the invention.
Figure 4:
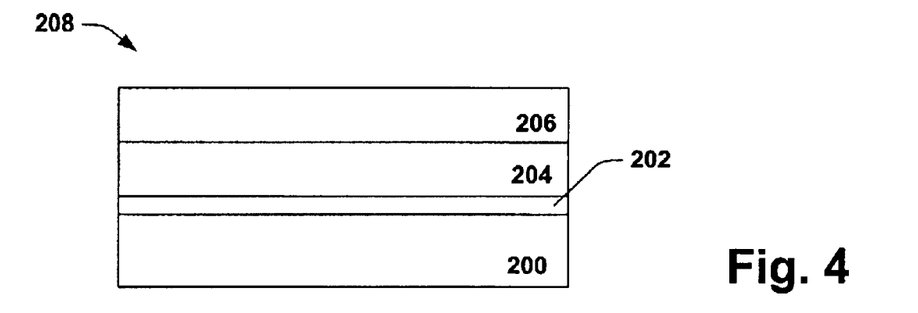
FIG. 4 illustrates a cross sectional view of an organic memory cell containing a CuX layer in formed in accordance with one aspect of the invention.

Referring to FIGS. 2 to 4, an example of forming a CuX layer and organic semiconductor memory cell in accordance with one aspect of the present invention is shown. Specifically referring to FIG. 2, an electrode 200 comprising copper is provided. The electrode is made of copper or a copper alloy. Referring to FIG. 3, sulfur is implanted (as shown by the arrows) into the copper electrode 200 thereby forming a thin copper sulfide layer 202 within the copper electrode 200. Referring to FIG. 4, an organic semiconductor layer 204 is formed over the copper sulfide layer 202, followed by positioning a second electrode 206 over the organic semiconductor layer 204 to form an organic semiconductor memory cell 208.

Figure 5:
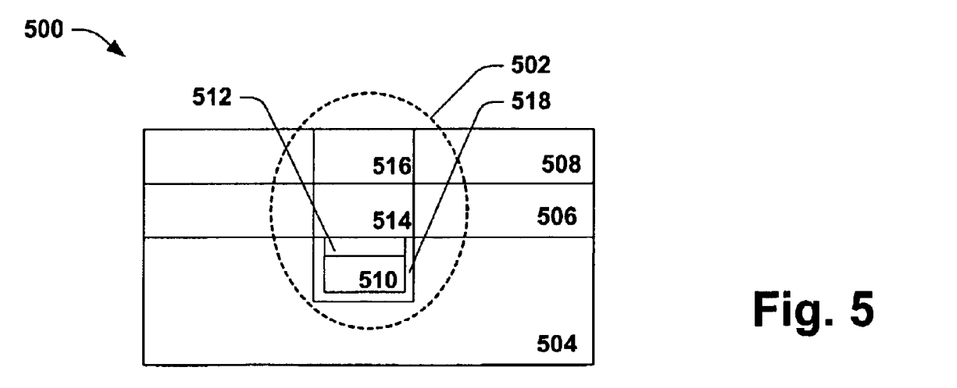
FIG. 5 illustrates another cross sectional view of an organic memory cell containing a CuX layer in accordance with one aspect of the invention.

Referring to FIG. 5, a structure 500 containing an organic semiconductor memory cell 502 made in accordance with the present invention is shown. The structure 500, which may be a portion of an organic semiconductor memory device, contains substrate 504, and dielectric layers 506 and 508. Organic semiconductor memory cell 502 contains copper containing electrode 510, a CuX layer 512, an organic semiconductor layer 514, and a second electrode 516, which may or may not contain copper. In this context, the CuX layer 512 is formed by implantation into the copper containing electrode 510 in accordance with the present invention, although a mask such as patterned resist may protect other areas of the structure from implantation.

Referring to FIG. 5, alternatively, the substrate 504 may be a dielectric structure 504, such as silicon dioxide, and a barrier layer 518 surrounds the copper electrode 510. Barrier layers include silicon nitride, tantalum, tantalum nitride, tungsten, and the like to prevent undesirable diffusion of copper throughout the structure 500.

In order to facilitate operation of the organic memory cells, the organic semiconductor layer is thicker than the CuX layer. In one embodiment, the thickness of the organic semiconductor layer is from about 10 to about 500 times greater than the thickness of the CuX layer. In another embodiment, the thickness of the organic semiconductor layer is from about 25 to about 250 times greater than the thickness of the CuX layer.

In one embodiment, the organic memory cells optionally contain a heterocyclic/aromatic compound layer. In another embodiment, the organic semiconductor layer is doped with a heterocyclic/aromatic compound. If present, the heterocyclic/aromatic compound layer has a thickness of about 0.001 μm or more and about 1 μm or less. Examples of the chemical structures of various heterocyclic/aromatic compounds specifically including nitrogen containing heterocycles, include Formulae (XVIII) to (XXIII):

(XVIII)

(XIX)

(XX)

(XXI)

(XXII)

(XXIII)

The area size of the individual organic memory cells (as measured by the surface area of the two electrodes directly overlapping each other) can be small compared to conventional silicon based inorganic memory cells such as MOSFETs. In one embodiment, the area size of the organic memory cells of the present invention is about 0.0001 $\mu m^2$ or more and about 4 $\mu m^2$ or less. In another embodiment, the area size of the organic memory cells is about 0.001 $\mu m^2$ or more and about 1 $\mu m^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the organic memory cell; whereas external stimuli that do not exceed a threshold value do not write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage opposite in polarity to the writing signal, that exceeds a threshold value, is applied.

The organic memory devices described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 6:
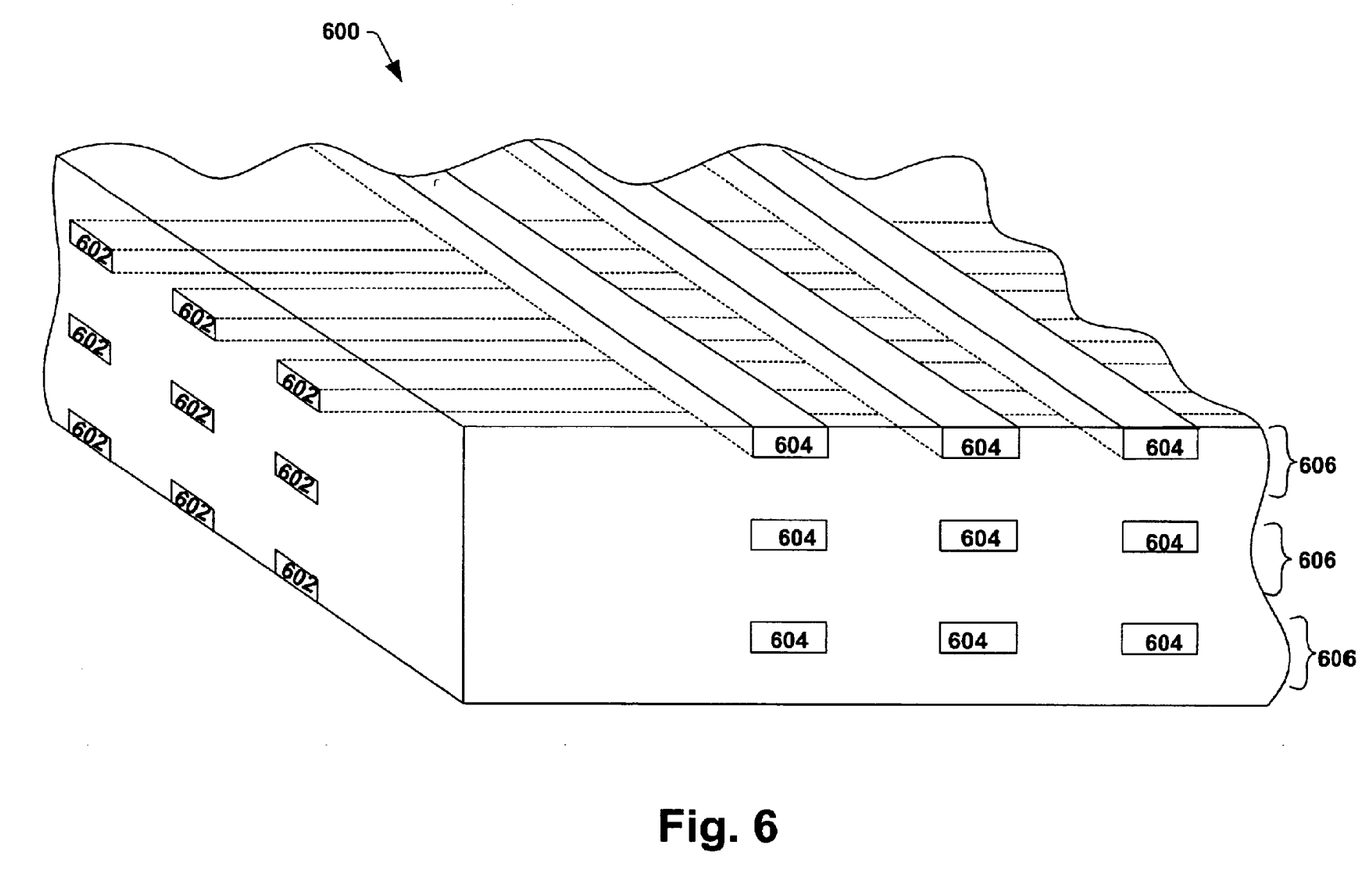
FIG. 6 illustrates a perspective view of a three dimensional microelectronic device containing a plurality of organic memory cells in accordance with another aspect of the invention.

Referring to FIG. 6, a three dimensional microelectronic organic memory device 600 containing a plurality of organic memory cells in accordance with an aspect of the invention is shown. The three dimensional microelectronic organic memory device 600 contains a plurality of first electrodes 602, a plurality of second electrodes 604, and a plurality of memory cell layers 606. Between the respective first and second electrodes are the controllably conductive media (not shown). The plurality of first electrodes 602 and the plurality of second electrodes 604 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an organic memory cell comprising:
   providing a first electrode comprising copper;
   implanting at least one Group VI element in the first electrode to form a CuX layer in the first electrode;
   optionally heating the CuX layer;
   forming an organic semiconductor layer comprising at least one of a conjugated organic polymer, a conjugated organometallic compound, a conjugated organometallic polymer, a buckyball, and a carbon nanotube over the CuX layer; and
   providing a second electrode over the organic semiconductor layer.

2. The method of claim 1, wherein the Group VI element is implanted at a concentration from about $1 \times 10^{11}$ to about $1 \times 10^{17}$ atoms/cm$^2$ at an energy level from about 1 keV to about 100 keV.

3. The method of claim 1, wherein the Group VI element is implanted at a concentration from about $1 \times 10^{12}$ to about $1 \times 10^{16}$ atoms/cm$^2$ at an energy level from about 10 keV to about 70 keV.

4. The method of claim 1, wherein the CuX layer is heated at a temperature from about 225° C. to about 450° C. for about 1 second to about 10 minutes after implanting the Group VI element and before forming the organic semiconductor layer.

5. The method of claim 4, wherein the CuX layer is heated in an atmosphere comprising at least one non-reactive gas selected from the group consisting of hydrogen, nitrogen, helium, neon, argon, krypton, and xenon.

6. The method of claim 1, wherein the Group VI element is selected from the group consisting of oxygen, sulfur, selenium, and tellurium.

7. A method of making an organic memory cell comprising:
   providing a first electrode comprising copper;
   implanting at least one selected from the group consisting of oxygen, sulfur, selenium, and tellurium in the first electrode at a concentration from about $1 \times 10^{15}$ to about $1 \times 10^{17}$ atoms/cm$^2$ at an energy level from about 0.1 keV to about 50 keV to form a CuX layer in the first electrode;
   annealing the CuX layer at a temperature from about 200° C. to about 500° C. for about 0.1 second to about 30 minutes;
   forming an organic semiconductor layer comprising at least one of a conjugated organic polymer, a conjugated organometallic compound, a conjugated organometallic polymer, a buckyball, and a carbon nanotube over the CuX layer; and
   providing a second electrode over the organic semiconductor layer.

8. The method of claim 7, wherein sulfur is implanted into the first electrode.

9. The method of claim 7, wherein the organic semiconductor layer comprises a conjugated organic polymer, and the conjugated organic polymer is formed by chemical vapor deposition and a catalytic action of the CuX layer.

10. A method of making an organic memory cell comprising:
    providing a first electrode comprising copper;
    implanting at least one Group VI element in the first electrode to form a CuX layer having a thickness of about 2 Å or more and about or 0.1 µm less in the first electrode, the Group VI element being implanted at a concentration from about $1 \times 10^{11}$ to about $1 \times 10^{17}$ atoms/cm$^2$ at an energy level from about 1 keV to about 100 keV;
    optionally heating the CuX layer;
    forming an organic semiconductor layer comprising at least one of a conjugated organic polymer, a conjugated organometallic compound, and a conjugated organometallic polymer over the CuX layer; and
    providing a second electrode over the organic semiconductor layer.

11. The method of claim 10, wherein the CuX layer comprises at least one selected from the group consisting of copper sulfide, copper rich copper sulfide, copper selenide, and copper telluride.

12. The method of claim 10, wherein the Group VI element is implanted at a concentration from about $1 \times 10^{12}$ to about $1 \times 10^{16}$ atoms/cm$^2$ at an energy level from about 10 keV to about 70 keV.

13. The method of claim 10, wherein the CuX layer is heated at a temperature from about 225° C. to about 450° C. for about 1 second to about 10 minutes after implanting the Group VI element and before forming the organic semiconductor layer.

14. The method of claim 13, wherein the CuX layer is heated in an atmosphere comprising at least one non-reactive gas selected from the group consisting of hydrogen, nitrogen, helium, neon, argon, krypton, and xenon.

15. The method of claim 10, wherein the Group VI element is selected from the group consisting of sulfur, selenium, and tellurium.

16. The method of claim 10, wherein the organic semiconductor layer comprises a conjugated organic polymer, and the conjugated organic polymer is formed by chemical vapor deposition and a catalytic action of the CuX layer.

17. The method of claim 10, wherein the organic semiconductor layer comprises at least one conjugated organic polymer selected from the group consisting of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes, polyphthalocyanines; polyvinylenes; and polystiroles.

18. The method of claim 10, wherein the organic semiconductor layer comprises polydiphenylacetylene.

19. The method of claim 10, wherein the organic semiconductor layer comprises polythiophene.

20. The method of claim 10, wherein the organic semiconductor layer comprises polyacetylene.

* * * * *